(12) United States Patent
Xie

(10) Patent No.: US 11,522,088 B2
(45) Date of Patent: Dec. 6, 2022

(54) DISPLAY PANEL, MANUFACTURING METHOD THEREOF, AND DISPLAY DEVICE

(71) Applicant: Shenzhen China Star Optoelectronics Semiconductor Display Technology Co., Ltd., Shenzhen (CN)

(72) Inventor: Huafei Xie, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/622,919

(22) PCT Filed: Nov. 27, 2019

(86) PCT No.: PCT/CN2019/121129
§ 371 (c)(1),
(2) Date: Dec. 16, 2019

(87) PCT Pub. No.: WO2021/088153
PCT Pub. Date: May 14, 2021

(65) Prior Publication Data
US 2022/0262956 A1    Aug. 18, 2022

(30) Foreign Application Priority Data
Nov. 7, 2019 (CN) .......................... 201911080068.4

(51) Int. Cl.
*H01L 29/00* (2006.01)
*H01L 29/786* (2006.01)
(Continued)

(52) U.S. Cl.
CPC .. *H01L 29/78696* (2013.01); *H01L 29/42384* (2013.01); *H01L 29/66765* (2013.01);
(Continued)

(58) Field of Classification Search
CPC ......... H01L 29/78696; H01L 29/42384; H01L 29/66765; H01L 29/66969; H01L 29/78678; H01L 29/7869
See application file for complete search history.

(56) References Cited

U.S. PATENT DOCUMENTS 7,586,197 B2 *  9/2009  Lee ....................... H01L 29/458
                                                              257/762
8,536,029 B1    9/2013  Chang et al.
(Continued)

FOREIGN PATENT DOCUMENTS

CN    101147262 A    3/2008
CN    103022150 A    4/2013
(Continued)

*Primary Examiner* — Nikolay K Yushin
(74) *Attorney, Agent, or Firm* — Nathan & Associates; Menachem Nathan

(57) ABSTRACT

The disclosure provides a display panel, a manufacturing method thereof, and a display device. The display panel includes a substrate layer, a gate layer, an insulating layer, and an active layer. The gate layer is disposed on the substrate layer and includes a first gate layer and a second gate layer. The second gate layer is disposed on a surface of the first gate layer. The insulating layer covers the gate layer and the substrate layer. The active layer is disposed on a surface of the insulating layer away from the gate layer. The active layer includes a first layer section and a second layer section connected to the first layer section, and a surface of the second layer section is above a surface of the first section layer.

10 Claims, 4 Drawing Sheets

(51) Int. Cl.
*H01L 29/423* (2006.01)
*H01L 29/66* (2006.01)

(52) U.S. Cl.
CPC .... *H01L 29/66969* (2013.01); *H01L 29/7869* (2013.01); *H01L 29/78678* (2013.01)

(56) References Cited

U.S. PATENT DOCUMENTS

| | | | |
|---|---|---|---|
| 9,087,907 B2* | 7/2015 | Kim | H01L 29/66742 |
| 2007/0013077 A1* | 1/2007 | Lee | H01L 27/12 |
| | | | 257/E29.147 |
| 2007/0246702 A1 | 10/2007 | Andrieu | |
| 2015/0034942 A1* | 2/2015 | Kim | H01L 29/78696 |
| | | | 257/43 |

FOREIGN PATENT DOCUMENTS

| | | |
|---|---|---|
| CN | 105308752 A | 2/2016 |
| CN | 105633101 A | 6/2016 |
| CN | 106847927 A | 6/2017 |
| CN | 109244081 A | 1/2019 |

\* cited by examiner

DISPLAY PANEL, MANUFACTURING METHOD THEREOF, AND DISPLAY DEVICE

CROSS-REFERENCE TO RELATED APPLICATION

This application claims priority to China Patent Application No. 201911080068.4 filed on Nov. 7, 2019, in the National Intellectual Property Administration and entitled "DISPLAY PANEL, MANUFACTURING METHOD THEREOF, AND DISPLAY DEVICE", the disclosure of which is incorporated herein by reference.

FIELD

The present disclosure relates to the field of display device and, more particularly, relates to a display panel, a manufacturing method thereof, and a display device.

BACKGROUND

Metal oxide thin film transistors (MO-TFTs), and in particular, indium gallium zinc oxide thin film transistors (IGZO-TFTs), are widely used in display panel industry due to their advantages such as good consistency, high mobility, low leakage current, and suitability for large-scale production.

Typically, a structure of conventional MO-TFTs is a back channel etching (BCD) structure, an etch stop layer (ESL) structure, or a top-gate structure. However, performance of TFT devices having the BCE structure are relatively poor because an acid etching solution for a source/drain etches and damages an active layer; TFT devices having the top-gate structure are not applied to liquid crystal display (LCD) devices due to their complicated structures, complex manufacturing process, and high production cost. As to TFT devices having the ESL structure, they have an etch blocking layer which can effectively protect a tunnel from being etched by an acid etching solution; furthermore, their structures are less complicated than the top-gate structure so that performances of devices are better and manufacturing processes thereof are more matured. Nonetheless, sizes of the devices are difficult to be reduced, thereby affecting transmittances of LCD devices.

SUMMARY

An objective of the present disclosure is to provide a display panel, a manufacturing method thereof, and display device to solve problems that conventional metal oxide TFT devices having the ESL structure are complicated, which affects transmittances of display panels.

To realize the above objective, the present disclosure provides a display panel, including a substrate layer, a gate layer, an insulating layer, and an active layer. The gate layer is disposed on the substrate layer, wherein the gate layer includes a first gate layer and a second gate layer, and the second gate layer is disposed on a surface of the first gate layer. The insulating layer covers the first gate layer, the second gate layer, and the substrate layer. The active layer is disposed on a surface of the insulating layer away from the gate layer, wherein the active layer includes a first layer section and a second layer section connected to the first section, and a surface of the second layer section is above a surface of the first layer section.

Furthermore, the display panel further includes an etch blocking layer, a source layer, and a passivation layer. The etch blocking layer is disposed on the insulating layer and covering a portion of the active layer; The source layer is disposed on the insulating layer, wherein the source layer covers a portion of the active layer and simultaneously corresponds to the second gate layer. The passivation layer covering the source layer and the etch blocking layer.

Furthermore, the display panel further includes a pixel electrode layer disposed on the passivation layer. A contact hole is further defined in the passivation layer and the etch blocking layer, wherein the contact hole extends through the passivation layer and the etch blocking layer and reaches a surface of the active layer, the contact hole is correspondingly defined in a side of the active layer away from the source layer, and the pixel electrode layer is connected to the active layer by the contact hole.

Furthermore, an area of the second gate layer is less than an area of the first gate layer.

Furthermore, a material of the active layer includes polysilicon or metal oxide.

Furthermore, the metal oxide includes one or more of indium gallium zinc oxide, zinc oxide, zinc titanium oxide, and indium gallium zinc titanium oxide.

The present disclosure further provides a method of manufacturing a display panel, including the following steps:

step 10: providing a substrate layer;
step 20: forming a gate layer on the substrate layer;
step 30: forming an insulating layer on the gate layer and the substrate layer; and
step 40: forming an active layer on the insulating layer.

The step of forming the gate layer includes: forming a first gate layer on the substrate layer, and forming a second gate layer on the first gate layer.

Furthermore, the method further includes the following steps:

step 50: forming an etch blocking layer on the active layer and the insulating layer;
step 60: forming a source layer on the insulating layer and the active layer; and
step 70: forming a passivation layer on the insulating layer, the source layer, and the etch blocking layer.

Furthermore, the method further includes the following step:

step 80: forming a pixel electrode layer on the passivation layer: forming a contact hole in the passivation layer and the etch blocking layer, and depositing conductive material in the contact hole and on the passivation layer to form the pixel electrode layer.

The present disclosure further provides a display device including the above display panel.

Regarding the beneficial effects: the present disclosure provides a display panel. By increasing a height of a gate layer, a gap is formed on an active layer in vertical direction. A length of a tunnel of the active layer can be adjusted by the gap, thereby reducing a length and an area of a tunnel in TFT display panels and improving an aperture ratio of the display panels. At the same time, a pixel electrode is directly contacted with the active layer, which significantly simplifies a structure of the display panels.

DETAILED DESCRIPTION

Figure 1:
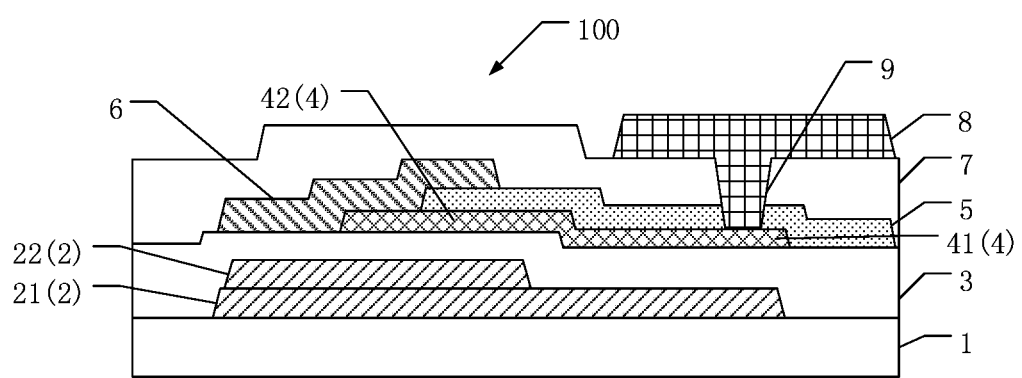
FIG. 1 is a schematic view showing a layered structure of a display panel according to an embodiment of the present disclosure.

Preferred embodiments of the present disclosure are illustrated below with reference to accompanying drawings to prove that the present disclosure can be implemented. The embodiments are used to fully describe technical solutions of the present disclosure so that those skilled in the art may clearly and easily understand the technical solutions. The present disclosure may be realized by many different types of embodiments; therefore, the scope of protection of the present disclosure is not limited to the embodiments mentioned in the specification.

The identical or similar reference numerals constantly denote the identical or similar elements or elements having the identical or similar functions. The size and thickness of each component shown in the drawings are arbitrarily shown, but the present disclosure is not limited thereto. In the drawings, the thicknesses of some layers and regions are exaggerated for the purpose of understanding and ease of description.

In addition, the following description of the various embodiments is provided with reference to the accompanying drawings to demonstrate that the embodiments of the present disclosure may be implemented. In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first", "second", and "third" are used herein for purposes of description and are not intended to indicate or imply relative importance or significance.

It should be noted that a structure in which a first feature is "on" a second feature may include an embodiment in which the first feature directly contacts the second feature and may also include an embodiment in which an additional feature is formed between the first feature and the second feature. It should be noted that a structure in which a first feature is "mounted on" or "connected to" a second feature may include an embodiment in which the first feature directly mounted on or connected to the second feature and may also include an embodiment in which the first feature is mounted on or connected to the second feature by an additional feature.

An embodiment of the present disclosure provides a display panel 100, as shown in FIG. 1, the display panel 100 includes a substrate layer 1, a gate layer 2, an insulating layer 3, an active layer 4, an etch blocking layer 5, a source layer 6, and a passivation layer 7.

The substrate layer 1 is an insulating substrate made of insulating materials such as glass and quartz. The substrate layer 1 is used to protect the entire structure of the display panel 100.

The gate layer 2 is disposed on the substrate layer 1. The gate layer 2 includes a first gate layer 21 and a second gate layer 22, the first gate layer 21 is disposed on the substrate layer 1, and the second gate layer 22 is disposed on a surface of the first gate layer 21 away from the substrate layer 1. An area of the second gate layer 22 is less than an area of the first gate layer 21 so that the gate layer 2 has a step structure.

The insulating layer 3 covers the gate layer 2 and the substrate layer 1 and is used to protect the gate layer 2. The insulating layer 3 insulates the gate layer 2 from the active layer 4, thereby preventing a short circuit.

The active layer 4 is disposed on a surface of the insulating layer 3 away from the gate layer 2. The active layer 4 and the gate layer 2 correspond to each other. Since the gate layer 2 has a step structure, the insulating layer 3 that covers the gate layer 2 also has a step structure. As a result, the active layer 4 that is disposed on the insulating layer 3 and corresponds to the gate layer 2 has a first layer section 41 and a second layer section 42 which is connected to the first layer section 41. A surface of the second layer section 42 is above a surface of the first layer section 41. Therefore, a gap is formed on the active layer 4 in vertical direction, which reduces a length of a tunnel between two thin film transistors (TFTs) in the display panel 100.

The etch blocking layer 5 is disposed on a side of the insulating layer 3 and on a side of the active layer 4 and covers a side of the active layer 4 near the first layer section 41 of the active layer 4. The etch blocking layer 5 insulates and protects the active layer 4 so that the active layer 4 has high stability. The etch blocking layer 5 prevents the active layer 4 from being affected by an etchant, thereby effectively increasing stability and threshold voltage of the display panel 100.

The source layer 6 is disposed on the other side of the insulating layer 3 and on the other side of the active layer 4, covers a side of the active layer 4 near the second layer section 42 of the active layer 4, and connects with the second layer section 42 of the active layer 4. The source layer 6 and the etch blocking layer 5 fully covers and protects an exposed surface of the active layer 4.

The passivation layer 7 covers a surface of the source layer 6 away from the active layer 4 and a surface of the etch blocking layer 5 away from the active layer 4. The passivation layer 7 is used to protect, passivate, and insulate the source layer 6

The display panel 100 further includes a pixel electrode layer 8 which is disposed on a surface of the passivation layer 7 away from the source layer 6. A contact hole 9 is defined in the etch blocking layer 5 and the passivation layer 7, passes through the etch blocking layer 7 and the etch blocking layer 5, and reaches a surface of the first layer section 41 of the source layer 4. The pixel electrode layer 8 is connected to a side of the first layer section 41 of the source layer 4 by the contact hole 9.

The insulating layer 3, the etch blocking layer 5, and the passivation layer 7 may be made of one or more of silicon oxide and silicon nitride which are non-organic materials with moisture-blocking effect. The gate layer 2 and the source layer 6 may be made of Cu, Ti, Mo, Al, or combinations thereof which have exceptional conductivity. A material of the pixel electrode layer 8 may be indium tin oxide (ITO). A material of the active layer may be polysilicon or conductive metal oxide. The conductive material oxide may be one or more of indium gallium zinc oxide (IGZO), zinc oxide (ZnO), indium gallium zinc titanium oxide (IGZTO), and zinc titanium oxide (ZTO).

A voltage is applied to the gate layer 2 of the display panel 100 to generate an electric field so that an induced charge generates on a surface of the active layer 4, which changes a width of a conductive tunnel, thereby achieving a goal of controlling current of the source layer 6. The pixel electrode layer 8 directly connects with the source layer 4. A current of the pixel electrode layer 8 may be directly controlled by the active layer 4. Therefore, light intensity of a luminescent device connected to the pixel electrode layer 8 may be controlled as well. As a result, images can be displayed.

Figure 2:
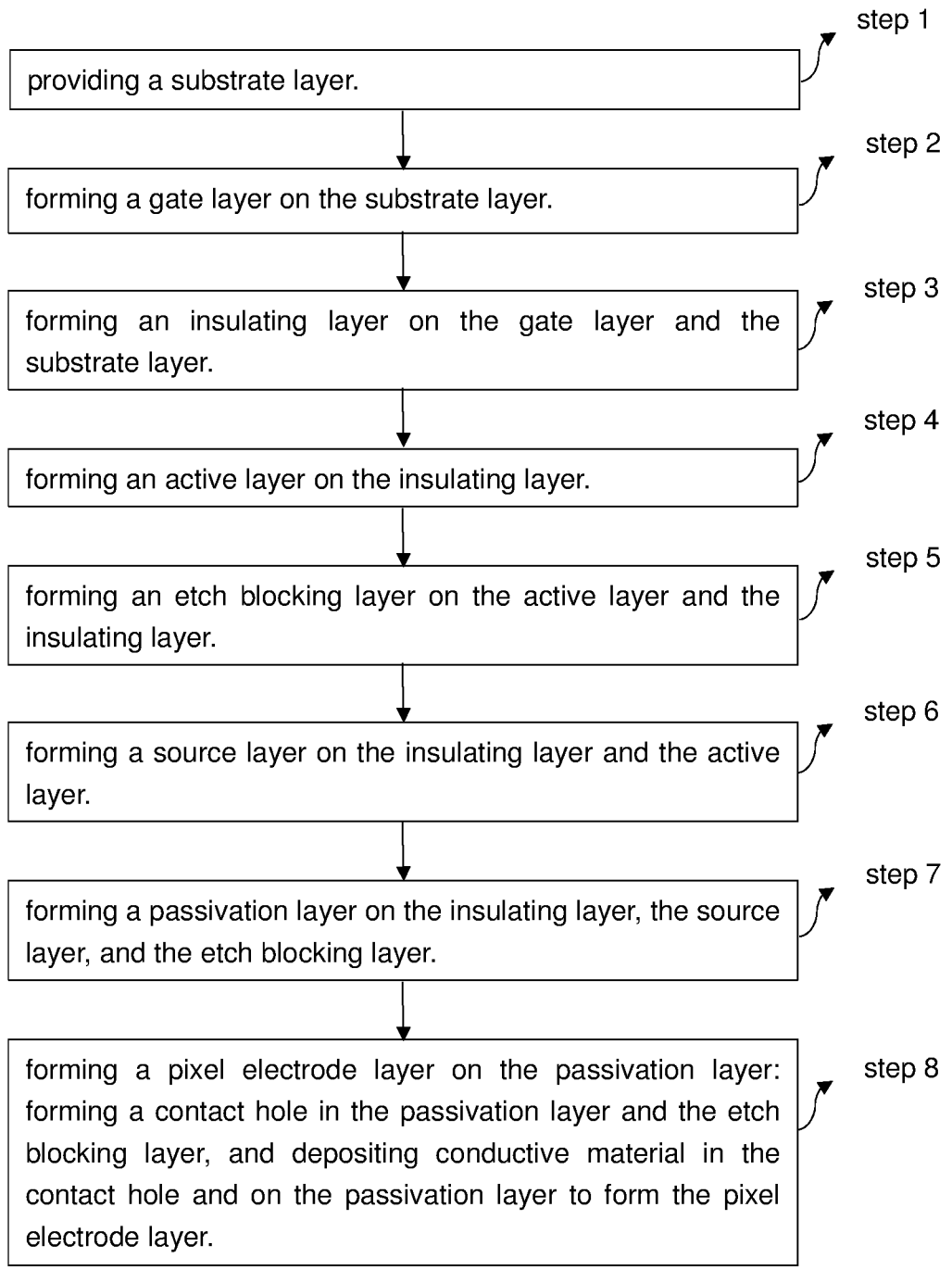
FIG. 2 is a schematic flowchart showing a manufacturing method of a display panel according to an embodiment of the present disclosure.
Figure 3:
FIG. 3 is a schematic view of a layered structure of a display panel during step 10 according to an embodiment of the present disclosure.

An embodiment of the present disclosure further provides a method of manufacturing the above display panel 100, as shown in FIG. 2, including the following steps:

Step 10: providing a substrate layer 1. As shown in FIG. 3, the substrate layer 1 is provided, wherein the substrate layer 1 is an insulating substrate which may be a glass substrate or a quartz substrate.

Step 20: forming a gate layer 2 on the substrate layer 1.

Figure 4:
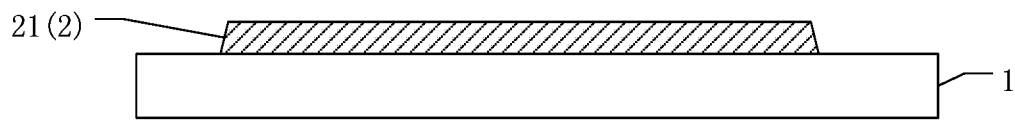
FIG. 4 is a schematic view of a layered structure of the display panel during step 20 according to the embodiment of the present disclosure.

Forming a first gate layer 21 on the substrate layer 1: as shown in FIG. 4, a first metal layer is deposited on the substrate layer 1 by physical vapor deposition (PVD), then the first metal layer is patterned by a lithography process to form the first gate layer 21.

Figure 5:
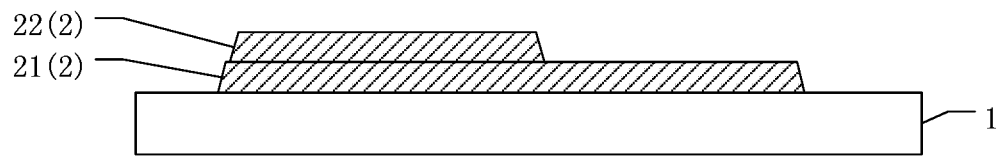
FIG. 5 is a schematic view of a layered structure of the display panel during step 20 according to an embodiment of the present disclosure.

Forming a second gate layer 22 on the first gate layer 21: as shown in FIG. 5, the second metal layer is deposited on the first gate layer 21 by physical vapor deposition (PVD), then the second metal layer is patterned by a lithography process to form the second gate layer 22.

An area of the second gate layer 22 is less than an area of the first gate layer 21.

Figure 6:
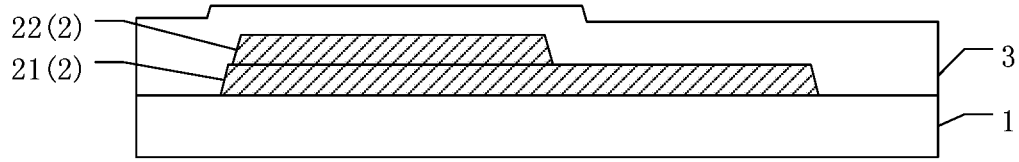
FIG. 6 is a schematic view of a layered structure of the display panel during step 30 according to the embodiment of the present disclosure.

Step 30: forming an insulating layer 3 on the gate layer 2 and the substrate layer 1. As shown in FIG. 6, a layer of an organic material is deposited on the gate layer 2 and the substrate layer 1 by chemical vapor deposition (CVP) to form the insulating layer 3.

Figure 7:
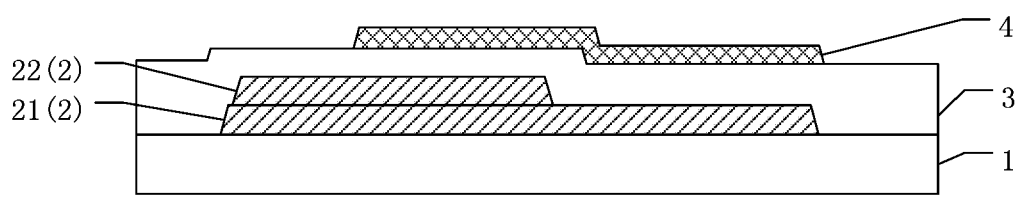
FIG. 7 is a schematic view of a layered structure of the display panel during step 40 according to the embodiment of the present disclosure.

Step 40: forming an active layer 4 on the insulating layer 3. As shown in FIG. 7, a metal oxide material is deposited on a surface of the insulating layer 3 away from the gate layer 2, then the metal oxide material is patterned by an etching process to form the active layer 4.

Figure 8:
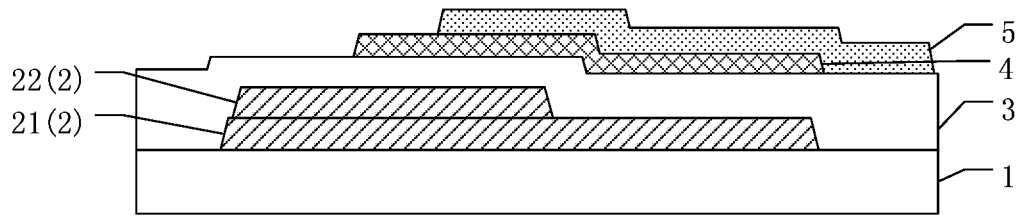
FIG. 8 is a schematic view of a layered structure of the display panel during step 50 according to the embodiment of the present disclosure.

Step 50: forming an etch blocking layer 5 on the active layer 4 and the insulating layer 3. As shown in FIG. 8, a layer of a non-organic material is deposited on the active layer 4 and the insulating layer 3 by CVP, then the non-organic material is patterned by a lithography process to form the etch blocking layer 5.

Figure 9:
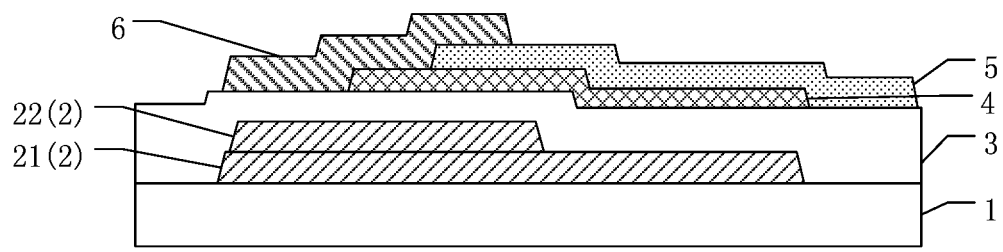
FIG. 9 is a schematic view of a layered structure of the display panel during step 60 according to an embodiment of the present disclosure.

Step 60: forming a source layer 6 on the insulating layer 3 and the active layer 4. As shown in FIG. 9, a third metal layer is formed on the insulating layer 3, the active layer 4, and the etch blocking layer 5 by PVD, then the third metal layer is patterned by a lithography process to form the source layer 6.

Figure 10:
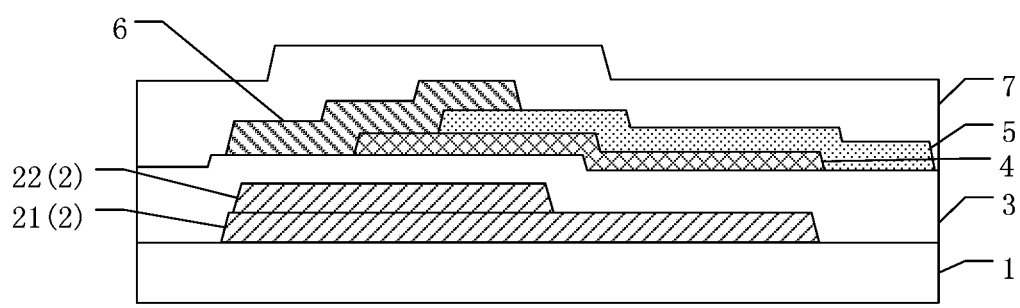
FIG. 10 is a schematic view of a layered structure of the display panel during step 70 according to the embodiment of the present disclosure.
Figure 11:
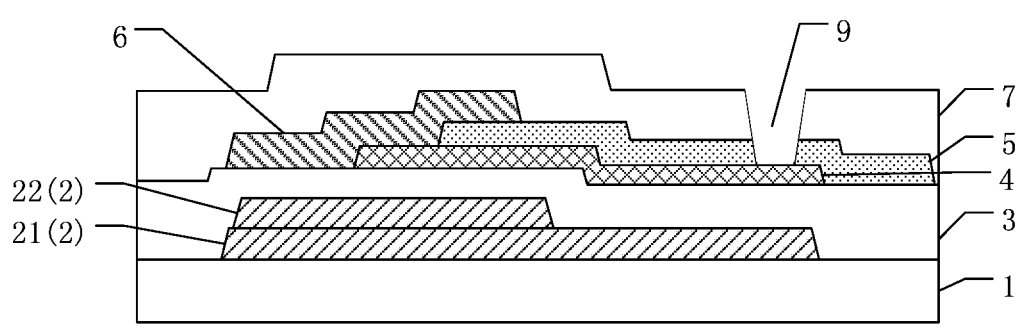
FIG. 11 is a schematic view of a layered structure of the display panel during step 80 according to the embodiment of the present disclosure.

Step 70: forming a passivation layer 7 on the insulating layer 3, the source layer 6, and the etch blocking layer 5. As shown in FIG. 10, a layer of a non-organic material is deposited on the insulating layer 3, the source layer 6, and the etch blocking layer 5 by CVD to form the passivation layer 7.

Step 80: forming a pixel electrode 8 on the passivation layer 7. As shown in FIG. 1, a contact hole 9 is defined in the passivation layer 7 and the etch blocking layer 5 by a dry-etching process, wherein the contact hole 9 passes through the passivation layer 7 and the etch blocking layer 5 and reaches a surface of the active layer 4. An ITO layer is deposited on the passivation layer 7 by PVD. The ITO layer is filled in the contact hole 9 and is in contact with the active layer 4. The ITO layer is patterned by a lithography process to form the pixel electrode layer 8 as shown in FIG. 1.

An embodiment of the present disclosure further provides a display device, including the display panel 100 manufactured by the above method. The display device may be a mobile phone, a tablet, a laptop, or any products or components with a display function.

The display panel 100 provided by the present embodiment includes the first gate layer 21 and the second gate layer 22. A height of the gate layer 2 is increased to form a step structure. Therefore, a gap is formed on the active layer 4, which is disposed on the gate layer 2, in vertical direction. A length of a tunnel of the active layer 4 can be adjusted by the gap, thereby reducing a length and an area of a tunnel in a TFT of the display panel 100 and improving an aperture ratio of the display device. At the same time, the pixel electrode layer 8 is directly contacted with the active layer 4, which significantly simplifies a structure of the display panel 100.

Although the present disclosure has been described with reference to specific embodiments, it should be noted that the embodiments are merely examples to show principles and applications of the present disclosure. Therefore, many changes and modifications to the described embodiment can be carried out without departing from the scope and the spirit of the disclosure that is intended to be limited only by the appended claims. It should be noted that dependent claims and features described in the specification may be combined to obtain a new claim which is different from the original independent claims. Furthermore, features described in an independent embodiment may be applied to other embodiments.

What is claimed is:
1. A display panel, comprising:
a substrate layer;
a gate layer disposed on the substrate layer, wherein the gate layer comprises a first gate layer and a second gate layer, and the second gate layer is disposed on a surface of the first gate layer, and part of an upper surface of the first gate layer, a lateral surface of the second gate layer, and an upper surface of the second gate layer form a z-shaped surface;

an insulating layer covering the first gate layer, the second gate layer, and the substrate layer; and an active layer disposed on a surface of the insulating layer away from the gate layer, wherein the active layer comprises a first layer section and a second layer section connected to the first section, a surface of the second layer section is above a surface of the first layer section, and the first layer section and the second layer section form a z-shaped structure.

2. The display panel of claim 1, wherein an area of the second gate layer is less than an area of the first gate layer.

3. A display device, comprising the display panel of claim 1.

4. The display panel of claim 1, wherein the display panel comprises:

an etch blocking layer disposed on the insulating layer and covering a portion of the active layer;

a source layer disposed on the insulating layer, wherein the source layer covers a portion of the active layer and simultaneously corresponds to the second gate layer; and a passivation layer covering the source layer and the etch blocking layer.

5. The display panel of claim 4, wherein the display panel comprises:

a pixel electrode layer disposed on the passivation layer;

a contact hole, wherein the contact hole extends through the passivation layer and the etch blocking layer and reaches a surface of the active layer, the contact hole is correspondingly defined in a side of the active layer away from the source layer, and the pixel electrode layer is connected to the active layer by the contact hole.

6. The display panel of claim 1, wherein material of the active layer comprises polysilicon or metal oxide.

7. The display panel of claim 6, wherein the metal oxide comprises one or more of indium gallium zinc oxide, zinc oxide, zinc titanium oxide, and indium gallium zinc titanium oxide.

8. A method of manufacturing a display panel, comprising following steps:

providing a substrate layer;

forming a gate layer on the substrate layer, wherein the gate layer comprises a first gate layer and a second gate layer, the second gate layer is disposed on a surface of the first gate layer, and part of an upper surface of the first gate layer, a lateral surface of the second gate layer, and an upper surface of the second gate layer form a z-shaped surface;

forming an insulating layer on the gate layer and the substrate layer; and forming an active layer on the insulating layer, wherein the active layer comprises a z-shaped structure;

wherein the step of forming the gate layer comprises following steps:

forming the first gate layer on the substrate layer; and forming the second gate layer on the first gate layer.

9. The method of claim 8, wherein the method comprises following steps:

forming an etch blocking layer on the active layer and the insulating layer;

forming a source layer on the insulating layer and the active layer; and forming a passivation layer on the insulating layer, the source layer, and the etch blocking layer.

10. The method of claim 9, wherein the method comprises following step:

forming a pixel electrode layer on the passivation layer: forming a contact hole in the passivation layer and the etch blocking layer, and depositing conductive material in the contact hole and on the passivation layer to form the pixel electrode layer.

\* \* \* \* \*